(12) United States Patent
Kong et al.

(10) Patent No.: US 7,259,447 B2
(45) Date of Patent: Aug. 21, 2007

(54) FLIP-CHIP TYPE NITRIDE SEMICONDUCTOR LIGHT EMITTING DIODE

(75) Inventors: Moon Heon Kong, Kyungki-do (KR);
Yong Chun Kim, Kyungki-do (KR);
Jae Hoon Lee, Kyungki-do (KR);
Hyung Ky Back, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 253 days.

(21) Appl. No.: 11/150,288

(22) Filed: Jun. 13, 2005

(65) Prior Publication Data

US 2006/0192206 A1  Aug. 31, 2006

(30) Foreign Application Priority Data

Feb. 25, 2005  (KR) .................... 10-2005-0016110

(51) Int. Cl.
*H01L 23/495* (2006.01)
(52) U.S. Cl. ........................... 257/676; 257/99
(58) Field of Classification Search ................ 257/676, 257/99, 79, 778, 81–82
See application file for complete search history.

(56) References Cited

U.S. PATENT DOCUMENTS 6,307,218 B1 * 10/2001 Steigerwald et al. .......... 257/99
6,445,007 B1 *  9/2002 Wu et al. ..................... 257/80

\* cited by examiner

*Primary Examiner*—Theresa Doan
(74) *Attorney, Agent, or Firm*—McDermott Will & Emery LLP

(57) ABSTRACT

Disclosed herein is a flip-chip type nitride semiconductor light emitting diode. The light emitting diode comprises an n-type nitride semiconductor layer formed on a transparent substrate and having a substantially rectangular upper surface, an n-side electrode which comprises at least one bonding pad adjacent to at least one corner of the upper surface of the n-type nitride semiconductor layer, extended electrodes formed in a band from the bonding pad along four sides of the upper surface of the n-type nitride semiconductor layer and one or more fingers extended in a diagonal direction of the upper surface from the bonding pad and/or the extended electrodes, an active layer and a p-type nitride semiconductor layer sequentially stacked on a region of the n-type nitride semiconductor layer where the n-side electrode is not formed, and a highly reflective ohmic contact layer formed on the p-type nitride semiconductor layer.

7 Claims, 5 Drawing Sheets

(a)

(b)

(a)

(b)

ℓ - ℓ`

(a)

(b)

FLIP-CHIP TYPE NITRIDE SEMICONDUCTOR LIGHT EMITTING DIODE

RELATED APPLICATIONS

The present invention is based on, and claims priority from, Korean Application Number 10-2005-0016110, filed Feb. 25, 2005, the disclosure of which is incorporated by reference herein in its entirety.

BACKGROUND OF THE INVENTION

1. Field of the Invention

The present invention relates to a flip-chip type nitride semiconductor light emitting diode, and more particularly, to a flip-chip type nitride semiconductor light emitting diode, which has an n-side electrode comprising at least one finger diagonally formed on an n-type nitride semiconductor layer of a nitride semiconductor light emitting diode having a substantially rectangular cross section, thereby lowering a driving voltage while suppressing heat generation.

2. Description of the Related Art

Generally, a nitride semiconductor refers to a III-V group semiconductor crystal, such as GaN, InN, AlN and the like, and is utilized for a light emitting device, which can emit light in a short wavelength range (from ultraviolet light to green light), especially blue light.

Since the nitride semiconductor light emitting diode is manufactured by use of an insulating substrate, such as a sapphire substrate or a SiC substrate, which satisfies lattice matching requirements for crystal growth, it has a planar structure in which two electrodes respectively connected to p-type and n-type nitride semiconductor layers are aligned substantially horizontally on an upper surface of the light emitting structure. Due to such a structural characteristic, the nitride semiconductor light emitting diode has been actively developed for a flip-chip type light emitting device.

In FIG. 1a, one example of a flip-chip type light emitting device having a conventional nitride semiconductor light emitting diode mounted thereon is illustrated. In FIG. 1a, the conventional nitride semiconductor light emitting diode 10 of the flip-chip type light emitting device is a small size diode having a cross sectional area of 400×400 $\mu m^2$ or less, and is driven at a low electric current of 20 mA or less.

The conventional nitride semiconductor light emitting diode 10 comprises an n-type nitride semiconductor layer 12, an active layer 13, a p-type nitride semiconductor layer 14, and an ohmic contact layer 15 sequentially formed from the bottom on a sapphire substrate 11. The nitride semiconductor light emitting diode 10 further comprises an n-side electrode 16 formed on an exposed region of an upper surface of the n-type nitride semiconductor layer 12, and a p-side electrode 17 formed on an upper surface of the ohmic contact layer 15.

The flip-chip type light emitting device 20 having such a conventional nitride semiconductor light emitting diode 10 mounted thereon has the construction in which the nitride semiconductor light emitting diode 10 is mounted on a supporting substrate 21 by fusing the respective electrodes 16 and 17 onto respective lead patterns 22a and 22b through conductive bumps 24a and 24b. In such a flip-chip type light emitting device 20, since the sapphire substrate 11 of the light emitting diode 10 is transparent, it can be used as a light emitting surface. The ohmic contact layer 15 is required to have a higher reflectivity which can reflect light emitted from the active layer 13 towards the light emitting surface (that is, the sapphire substrate 11) while providing an ohmic contact with the p-type nitride semiconductor layer 14.

Meanwhile, referring to FIG. 1b which is a top view of the conventional nitride light emitting diode, the conventional nitride light emitting diode has a substantially rectangular shape, and has the n-side electrode 16 formed adjacent to one corner of the rectangular shape. The conventional nitride semiconductor light emitting diode with the electrode structure as described above suffers a current crowding phenomenon wherein current is not uniformly spreaded as distance from the n-side electrode 16 is far, and is concentrated on a portion adjacent to the n-side electrode 16.

That is, referring to FIG. 1a, the conventional nitride semiconductor light emitting diode 10 has the planar electrode structure, and in particular, since the p-side ohmic contact layer 15 has a lower specific resistance in comparison to the p-type nitride semiconductor layer 14, there occurs the current crowding phenomenon where a significant amount of electric current is concentrated on a portion A adjacent to the n-side electrode 16 along the ohmic contact layer 15 as indicated by an arrow in FIG. 1a.

The current crowding phenomenon both increases forward voltage of light emitting diode and lowers brightness of the light emitting diode by reducing light emitting efficiency of a portion of the active layer relatively far from the n-side electrode. Moreover, heat is increasingly generated at the portion A where the electric current is concentrated, thereby significantly reducing reliability of the light emitting diode.

As such, since the conventional nitride semiconductor light emitting diode has the n-side electrode 16 located adjacent to the one corner of the upper surface of the nitride semiconductor light emitting diode, the current density is non-uniformly distributed over the entirety of the light emitting surface, thus the effective area of emitting light is limited and light emitting efficiency per area is low in comparison to a light emitting diode having a vertical structure in which two electrodes are located on upper and lower surfaces of the light emitting structure, respectively. Moreover, in comparison to the light emitting diode of the vertical structure, since electric current between the two electrodes is concentrated on a path having a shortest distance, the conventional nitride semiconductor light emitting diode has a narrower current path on which current density is concentrated, and since the electric current flows in the horizontal direction, it has a higher driving voltage due to a large series resistance.

In particular, due to these problems as described above, there is a significant difficulty in ensuring high power output from the light emitting diode for an illumination device having a large size (for example, 1,000×1,000 $\mu m^2$).

SUMMARY OF THE INVENTION

The present invention has been made in view of the above problems, and it is an object of the present invention to provide a flip-chip type nitride semiconductor light emitting diode having a new electrode structure, designed to enhance current spreading while preventing a current crowding phenomenon, thereby lowering driving voltage and heat generation while enhancing light emitting efficiency.

In accordance with one aspect of the present invention, the above and other objects can be accomplished by the provision of a flip-chip type nitride semiconductor light emitting diode, comprising: an n-type nitride semiconductor layer formed on a transparent substrate having a substantially rectangular upper surface; an n-side electrode, the n-side electrode having at least one bonding pad formed adjacent to at least one corner of the upper surface of the n-type nitride semiconductor layer, and extended electrodes formed in a band from the bonding pad along four sides of the upper surface of the n-type nitride semiconductor layer, and one or more fingers extended diagonally on the upper surface of the n-type nitride semiconductor layer from the bonding pad and/or the extended electrodes; an active layer and a p-type nitride semiconductor layer sequentially stacked on a region of the n-type nitride semiconductor layer where the n-side electrode is not formed; and a highly reflective ohmic contact layer formed on the p-type nitride semiconductor layer.

Preferably, the fingers comprise: a plurality of first fingers extended in parallel to each other diagonally to a corner of adjacent first and second sides of the upper surface of the n-type nitride semiconductor layer from the extended electrodes formed along the adjacent first and second sides and/or from the bonding pad formed at the corner of the adjacent first and second sides; and a plurality of second fingers extended opposite to the first fingers and in parallel to each other diagonally to a corner of adjacent third and fourth sides opposite to the corner of the first and second sides of the upper surface of the n-type nitride semiconductor layer from the extended electrodes formed along the adjacent third and fourth sides and/or from the bonding pad formed at the corner of the adjacent third and fourth sides. Preferably, the first and second fingers are alternately disposed.

Preferably, the flip-chip type nitride semiconductor light emitting diode further comprises: an insulating passivation layer between the n-side electrode and the p-type nitride semiconductor layer in order to electrically isolate the n-side electrode from the p-type nitride semiconductor layer.

Preferably, the highly reflective ohmic contact layer comprises at least one layer composed of a material selected from the group consisting of Ag, Ni, Al, Rh, Pd, Ir, Ru, Mg, Zn, Pt, Au and combinations thereof.

More preferably, the highly reflective ohmic contact layer comprises a first layer composed of a material selected from the group consisting of Ni, Pd, Ir, Pt and Zn, and a second layer formed on the first layer and composed of a material selected from the group consisting of Ag and Al.

Most preferably, the highly reflective ohmic contact layer comprises a first layer composed of Ni, a second layer formed on the first layer and composed of Ag, and a third layer formed on the second layer and composed of Pt.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
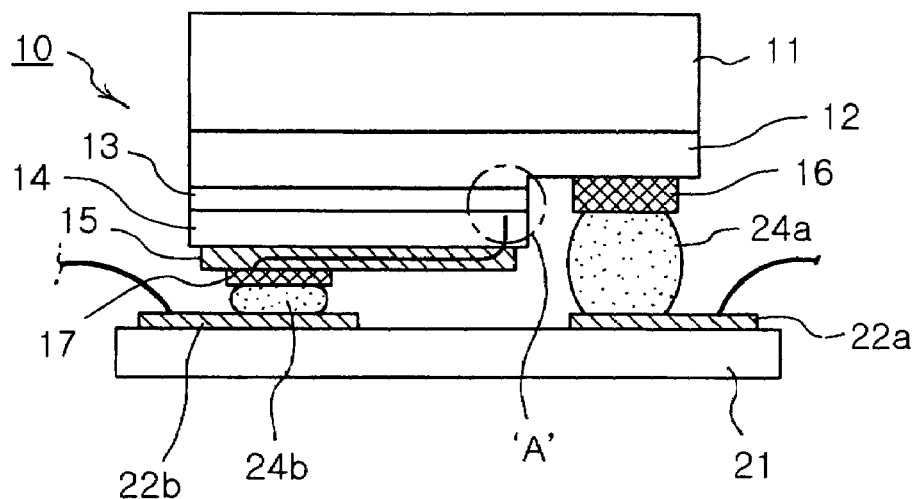
FIGS. 1a and 1b are a cross-sectional view illustrating a flip-chip type light emitting device having a conventional nitride semiconductor light emitting diode mounted thereon, and a top view illustrating the conventional nitride semiconductor light emitting diode, respectively.
Figure 1:
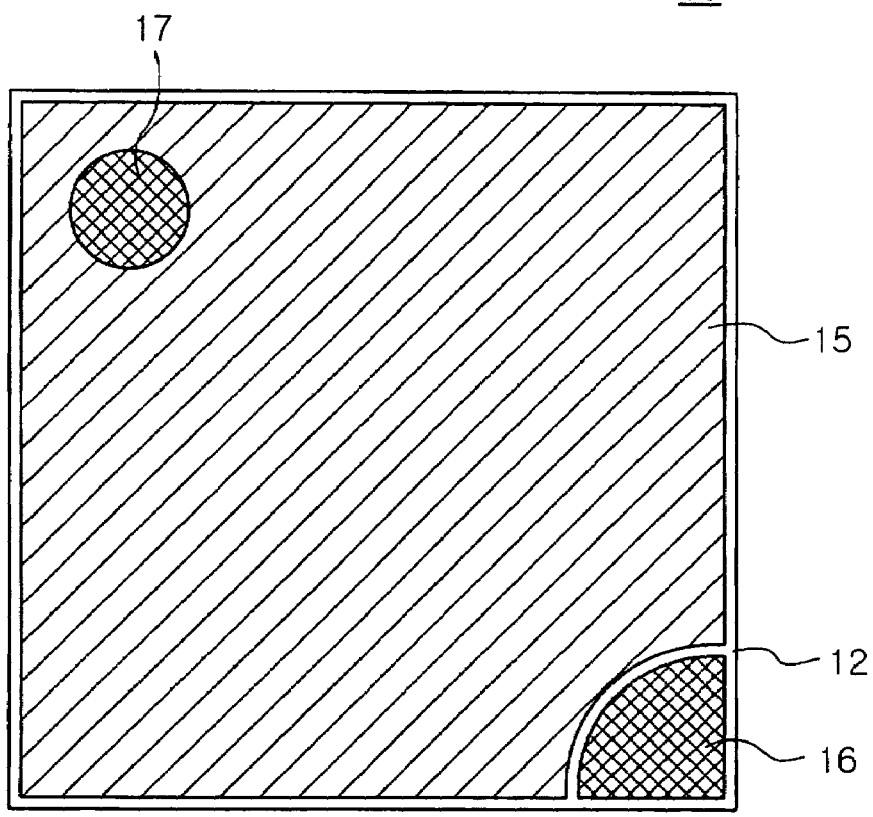

Preferred embodiments of the present invention will now be described in detail with reference to the accompanying drawings, in which like reference numerals refer to the like elements having similar functions and constructions.

Herein, the term "flip-chip type nitride semiconductor light emitting diode" means a nitride semiconductor light emitting diode employed for a light emitting device of a flip-chip structure, and in which a surface having a p-side bonding pad and an n-side electrode formed thereon will become a mounting surface bonded to a sub-mount of the light emitting device.

Figure 2:
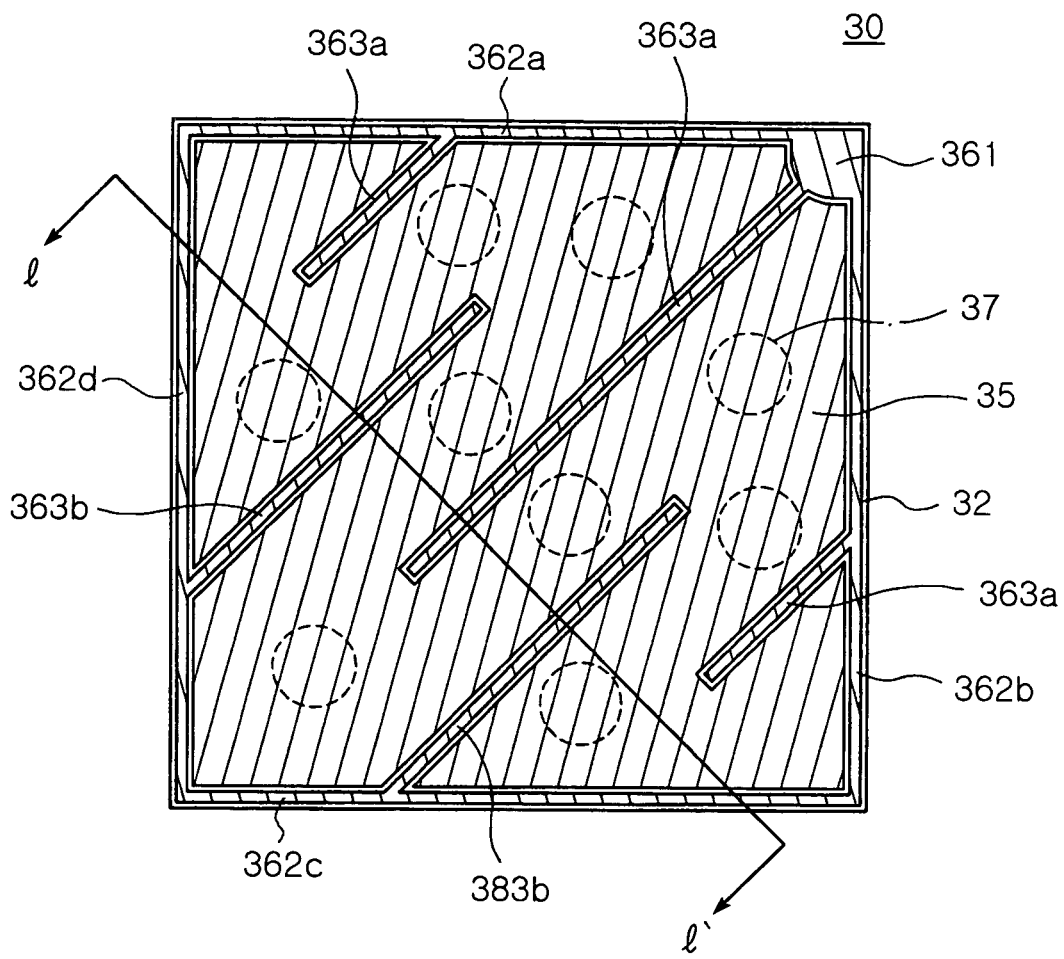
FIGS. 2a and 2b are a top view and a cross-sectional view illustrating a flip-chip type nitride semiconductor light emitting diode according to one embodiment of the present invention.
Figure 2:
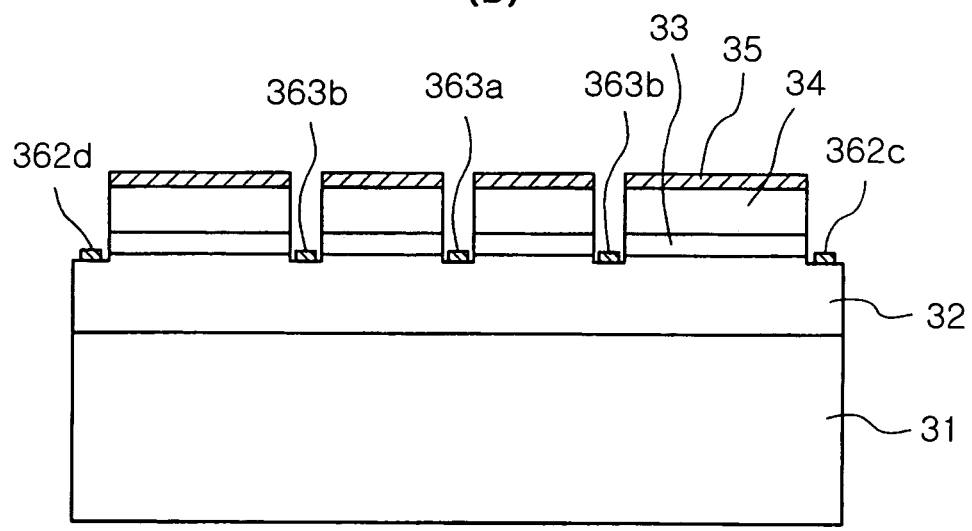

FIGS. 2a and 2b are a top view and a cross-sectional view illustrating a flip-chip type nitride semiconductor light emitting diode according to one embodiment of the invention. Referring to FIGS. 2a and 2b, the flip-chip type nitride semiconductor light emitting diode 30 according to one embodiment of the invention comprises an n-type nitride semiconductor layer 32 formed on a transparent substrate 31 and having a substantially rectangular upper surface; an n-side electrode which comprises at least one bonding pad 361 formed adjacent to at least one corner of the upper surface of the n-type nitride semiconductor layer 32, extended electrodes 362a, 362b, 362c and 362d formed in a band from the bonding pad 361 along four sides of the upper surface of the n-type nitride semiconductor layer 32, and one or more fingers 363a and 363b extended in a diagonal direction on the upper surface of the n-type nitride semiconductor layer 32 from the bonding pad 361 and/or the extended electrodes 362a, 362b, 362c and 362d; an active layer 33 and a p-type nitride semiconductor layer 34 sequentially formed on a region of the n-type nitride semiconductor layer 32 where the n-side electrode is not formed; and a highly reflective ohmic contact layer 35 formed on the p-type nitride semiconductor layer 34.

As for the transparent substrate 31, a sapphire substrate or a SiC substrate can be used because there is no commercial substrate which has an identical crystal structure to that of the nitride semiconductor material grown on the substrate while providing lattice matching therebetween. The sapphire substrate is a crystal with hexagonal-rhombohedral R3c symmetry, and has a lattice parameter of 13.001 Å in a c-axis direction, a lattice distance of 4.765 Å in an a-axis direction, and orientation planes of a C(0001) plane, an A(11$\bar{2}$0) plane, an R(1$\bar{1}$02) plane, and the like. Among the orientation planes of the sapphire substrate, since the C plane allows relatively easy growth of a GaN thin film, and is stable at high temperature, the sapphire substrate is mainly used for a substrate for a blue or green light emitting diode.

The n-type nitride semiconductor layer 32 may comprise an n-doped semiconductor material having the formula $Al_xIn_yGa_{(1-x-y)}N$ ($0 \leq x \leq 1$, $0 \leq y \leq 1$, $0 \leq x+y \leq 1$), such as GaN, AlGaN, and GaInN. An impurity doped to the n-type nitride semiconductor layer 32 includes Si, Ge, Se, Te, C or the like. The n-type nitride semiconductor layer 32 is formed by growing the semiconductor material on the transparent substrate 31 by use of a well-known deposition process, such as Metal Organic Chemical Vapor Deposition (MOCVD), Molecular Beam Epitaxy (MBE), or Hybrid Vapor Phase Epitaxy (HVPE).

Generally, a buffer layer may be formed between the transparent substrate 31 and the n-type nitride semiconductor layer 32 in order to relieve lattice mismatching. As for the buffer layer, a layer for low temperature nuclei growth, such as GaN or AlN, typically having a thickness of several dozen nm can be used.

The n-side electrode comprises the bonding pad 361, the extended electrodes 362a, 362b, 362c and 362d, and the fingers 363a and 363b.

When being applied to the flip-chip structure, the bonding pad 361 is a portion fused to a lead pattern on a supporting substrate via a conductive bump. The bonding pad 361 is formed near the corner of the upper surface of the n-side nitride semiconductor light emitting diode 32 having the generally rectangular shape. In FIGS. 2a and 2b, although the light emitting diode of the embodiment is described as having a single bonding pad 361, a plurality of bonding pads 361 may be respectively formed near corners of the upper surface of the n-type nitride semiconductor light emitting diode 32.

The extended electrodes 362a, 362b, 362c and 362d are formed in the band from the bonding pad 361 along the four sides of the upper surface of the n-type nitride semiconductor layer 32. Herein, for convenience of description, the extended electrodes 362a, 362b, 362c and 362d can be expressed as independent electrodes formed on the four sides of the upper surface of the n-type nitride semiconductor layer 32, respectively. That is, the extended electrodes 362a, 362b, 362c and 362d may be expressed as the extended electrode 362a formed on a first side, the extended electrode 362b formed on a second side, the extended electrode 362c formed on a third side, and the extended electrode 362d formed on a fourth side of the upper surface of the n-type nitride semiconductor layer 32, respectively.

The plurality of fingers 363a and 363b are extended in the diagonal direction on the upper surface of the n-type nitride semiconductor layer 32 from the bonding pad 361 and/or the extended electrodes 362a, 362b, 362c and 362d.

In particular, the fingers 363a and 363b comprise: a plurality of first fingers 363a extended in parallel to each other in the diagonal direction of the corner of adjacent first and second sides of the upper surface of the n-type nitride semiconductor layer 32 from the extended electrodes 362a and 362b formed along the adjacent first and second sides and/or from the bonding pad 361 formed at the corner of the first and second sides; and a plurality of second fingers 363b extended opposite to the first fingers 363a and in parallel to each other in the diagonal direction of the corner of adjacent third and fourth sides opposite to the corner of the first and second sides of the upper surface of the n-type nitride semiconductor layer 32 from the extended electrodes 362c and 362d formed along the adjacent third and fourth sides and/or from the bonding pad formed at the corner of the third and fourth sides.

Preferably, the first and second fingers 363a and 363b are alternately disposed.

According to the invention, in order to enhance current spreading in the flip-chip type nitride semiconductor light emitting diode, the plurality of fingers 363a and 363b are extended from the bonding pad 361 of the n-side electrode and/or the extended electrodes 362a, 362b, 362c and 362d in the diagonal direction on the upper surface of the n-type nitride semiconductor layer. The plurality of fingers 363a and 363b are formed as described above, whereby a distance between the n-side electrode and the highly reflective ohmic contact layer 35 can be reduced. In other words, the distance from a certain position on the ohmic contact layer 35 to the n-side electrode can be maintained in a very short distance. As a result, the present invention can solve the problems of the current crowding phenomenon and non-uniform current spreading caused by an increase in distance between the n-side electrode and the highly reflective ohmic contact layer 35 occurring when the bonding pad of the n-side electrode is formed at one side of the light emitting diode in the conventional nitride semiconductor light emitting diode.

The number and length of fingers must be determined under consideration of a space to be secured for forming a p-side bonding pad on the highly reflective ohmic contact layer in order to apply the nitride semiconductor light emitting diode to the flip-chip structure. In FIG. 2a, reference numeral 37 indicates an exemplary position on which the p-side bonding pad can be formed. According to the invention, the fingers 363a and 363b are formed in the diagonal direction on the upper surface of the n-side nitride semiconductor layer 32 in such a manner that the first and second fingers 363a and 363b are alternately arranged thereon, thereby allowing more and longer fingers to be formed while ensuring a more sufficient space for the p-side bonding pad compared with the structure in which the fingers are formed towards the opposite sides. The number and length of fingers are related to forward voltage and light emitting efficiency of the nitride semiconductor light emitting diode. As the number and length of fingers is increased, the light emitting efficiency is slightly reduced, but the forward voltage and heat generating characteristics of the diode are enhanced. These will be described below in detail.

In the construction as described above, the n-side electrode may comprise a single layer or a plurality of layers composed of a material selected from the group consisting of Ti, Cr, Al, Cu and Au. The n-side electrode may be formed by a deposition process or a sputtering process, which is a typical process for growing a metal layer.

The active layer 33 and the p-type nitride semiconductor layer 34 are sequentially formed on the region of the n-type nitride semiconductor layer 32 where the n-side electrode 32 is not formed.

The active layer 33 is a layer for emitting light, and comprises a nitride semiconductor layer, such as GaN or InGaN, having a single or multi-quantum well structure. As with the n-type nitride semiconductor layer 32, the active layer 33 is formed by use of well-known deposition processes, such as MOCVD, MBE, or HVPE.

As with the n-type nitride semiconductor layer 32, the p-type nitride semiconductor layer 34 is composed of a p-doped semiconductor material having the formula $Al_xIn_yGa_{(1-x-y)}N$ (where $0 \leq x \leq 1$, $0 \leq y \leq 1$, $0 \leq x+y \leq 1$), such as GaN, AlGaN, and GaInN. An impurity doped on the p-type nitride semiconductor layer 34 includes Mg, Zn, Be or the like. The p-type nitride semiconductor layer 34 is formed by growing the semiconductor material on the active layer 33 by use of well-known deposition processes, such as MOCVD, MBE, or HVPE.

Considering the structure of the flip-chip type nitride semiconductor light emitting diode, it is necessary to form the highly reflective ohmic contact layer 35 using a material appropriate for providing a high reflectivity while lowering a contact resistance with the p-type nitride semiconductor layer 34 having relatively high band gap energy. In order to satisfy the requirements for high reflectivity and enhanced contact resistance, the highly reflective ohmic contact layer 35 may comprise at least one layer composed of a material selected from the group consisting of Ag, Ni, Al, Rh, Pd, Ir, Ru, Mg, Zn, Pt, Au and combinations thereof, and have a reflectivity of 70% or more.

More preferably, the highly reflective ohmic contact layer 35 comprises a first layer composed of a material selected from the group consisting of Ni, Pd, Ir, Pt and Zn, and a second layer formed on the first layer and composed of a material selected from the group consisting of Ag and Al.

Most preferably, the highly reflective ohmic contact layer 35 comprises a first layer formed of Ni, a second layer formed on the first layer and composed of Ag, and a third layer formed on the second layer and composed of Pt.

The highly reflective ohmic contact layer 35 is formed by a well-known deposition process, such as chemical vapor deposition (CVD) or electron-beam evaporation, or by a process such as sputtering and the like, and is heat treated at a temperature of about 400~900° C. in order to enhance ohmic contact properties.

The p-side bonding pad 37 is formed on the highly reflective ohmic contact layer 35 for flip-chip bonding. The number of p-side bonding pads 37 is one or more as needed, and the p-side bonding pads 37 are fused on the lead pattern on the supporting substrate via the conductive bump upon flip-chip bonding. As shown in FIG. 2a, in the present embodiment, the p-side bonding pad 37 is formed on the upper surface of the highly reflective ohmic contact layer 35 between the fingers 363a and 363b. The p-side bonding pad 37 is generally formed of Au or an Au alloy.

Moreover, the flip-chip type nitride semiconductor light emitting diode further comprises a passivation layer (not shown) between the n-side electrode and the p-type nitride semiconductor layer 34 in order to electrically isolate the n-side electrode from the p-type nitride semiconductor layer 34. The passivation layer electrically isolates the n-side electrode and the p-type nitride semiconductor layer 34. The passivation layer may consist of an electrically insulating oxide or nitride.

Figure 3:
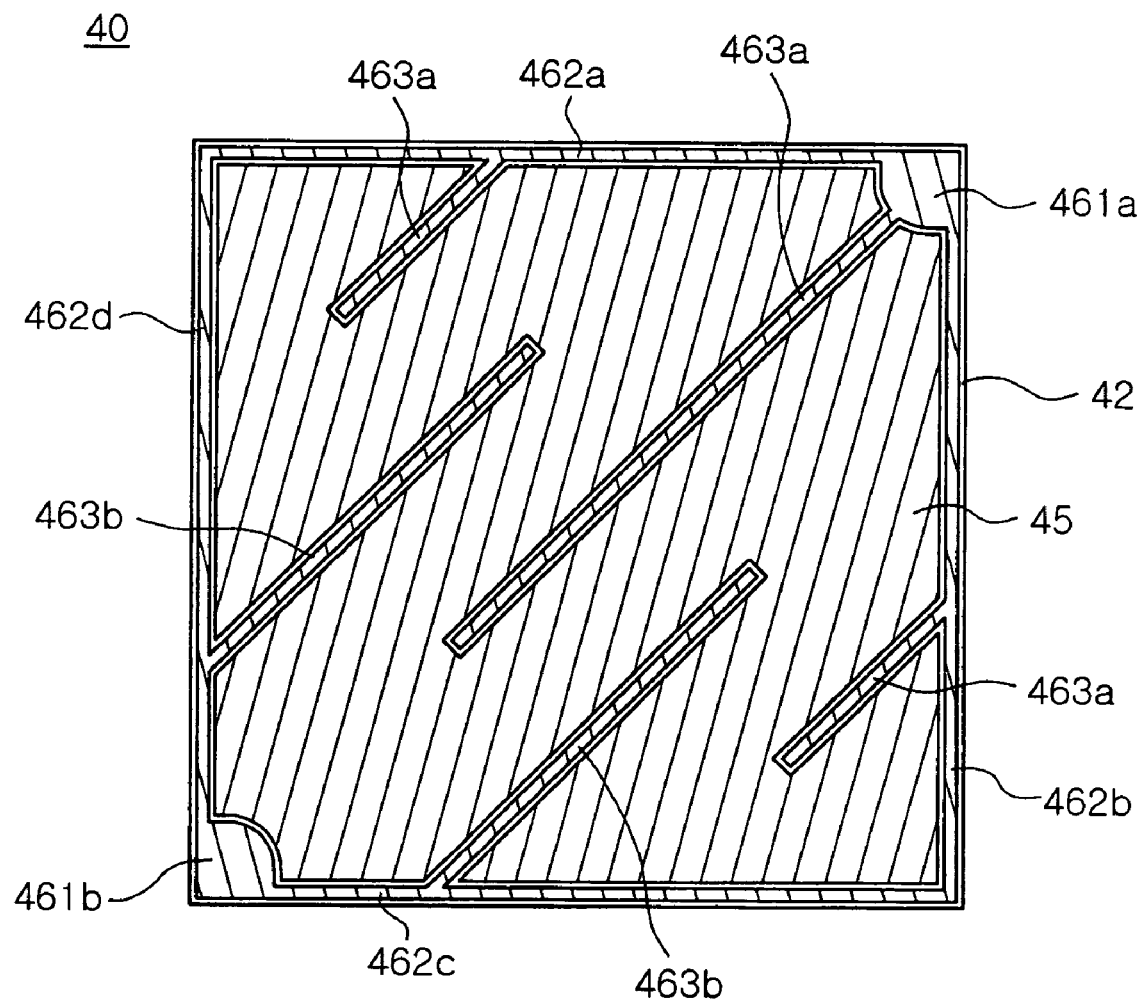
FIG. 3 is a top view illustrating a flip-chip type nitride semiconductor light emitting diode according to another embodiment of the present invention.

FIG. 3 is a top view illustrating a flip-chip type nitride semiconductor light emitting diode according to another embodiment of the present invention. Referring to FIG. 3, the flip-chip type nitride semiconductor light emitting diode according to the embodiment additionally comprises a second bonding pad 461b formed adjacent to a corner opposite to the corner of the upper surface of the n-side nitride semiconductor layer 32 where a first bonding pad 461a (361 of FIG. 2) is formed. As such, the electrode structure having two bonding pads 461a and 461b can lower the forward voltage while enhancing the light emitting efficiency in terms of increasing the number of means for injecting the electric current in a large nitride semiconductor light emitting diode. Although not shown in the drawings, the number of bonding pads may be three or four, and the bonding pads are formed adjacent to corners of the upper surface of the n-type nitride semiconductor layer having the rectangular shape.

Figure 4:
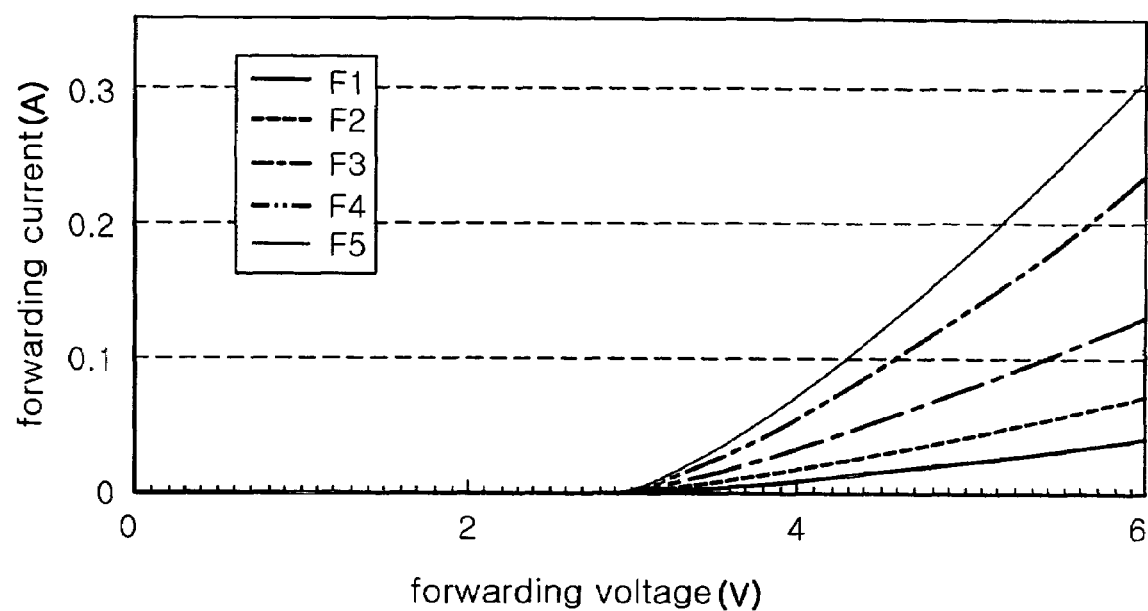
FIG. 4 is a graph showing characteristics of forward voltage according to the number of fingers.

FIG. 4 is a graph showing characteristics of the forward voltage according to the number of fingers. Referring to FIG. 4, the forward voltage of the nitride semiconductor light emitting diode was measured by changing the number of fingers from 1 to 5. In FIG. 4, it can be appreciated that, in the case F5 where the number of fingers is five under an identical forward voltage, maximum electric current is injected, and that as the number of fingers is decreased, injected current is gradually decreased. As such, it can be appreciated that as the number of fingers is increased, the characteristics of the forward voltage are enhanced, whereby heat generation characteristics are enhanced. Meanwhile, as the number of fingers is increased, a light emitting area is decreased due to the increased number of fingers, resulting in a reduction in space for forming the p-side bonding pad upon flip-chip bonding. Accordingly, when manufacturing the flip-chip nitride semiconductor light emitting diode, it is necessary to form an appropriate number of fingers.

Figure 5:
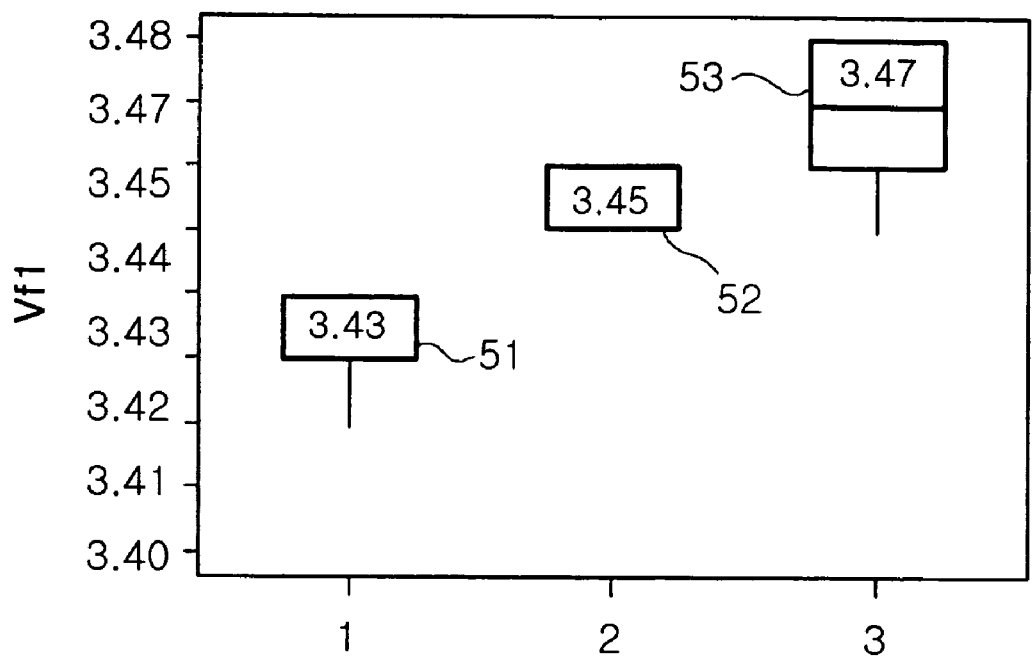
FIGS. 5a and 5b are graphs showing characteristics of the forward voltage and brightness according to variation in length of fingers in the flip-chip type nitride semiconductor light emitting diode shown in FIG. 3.
Figure 5:
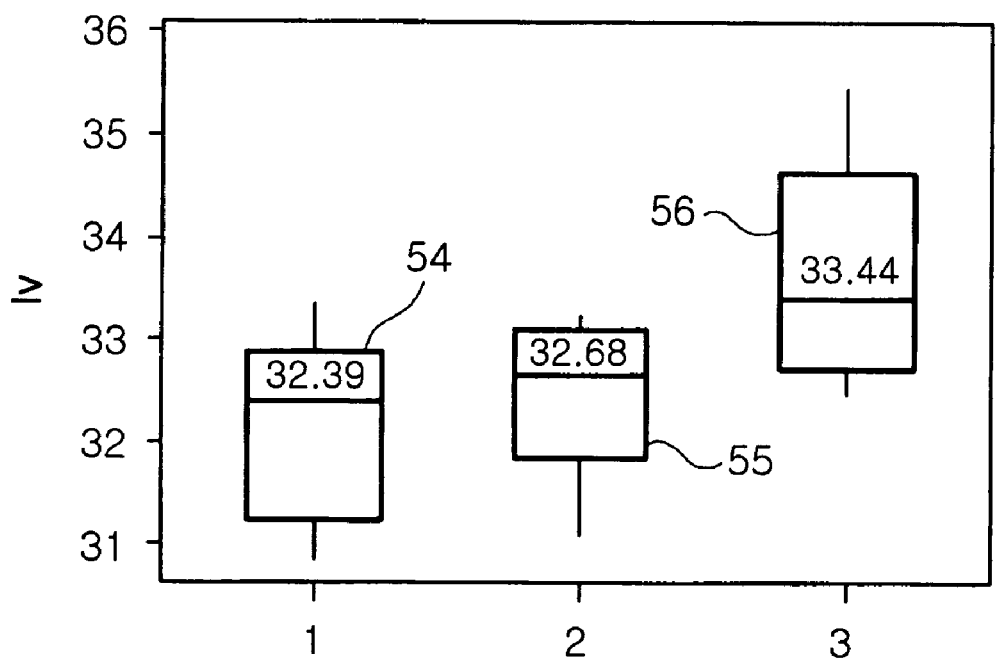

FIGS. 5a and 5b are graphs showing the characteristics of forward voltage and brightness according to variation in length of fingers in the flip-chip type nitride semiconductor light emitting diode shown in FIG. 3. In the graphs of FIGS. 5a and 5b, the x-axis indicates sample number, in which 1 indicates a sample having the longest finger, 2 indicates a sample having the next size finger, and 3 indicates a sample having the shortest finger.

First, referring to FIG. 5a, the sample having the longest finger provides the lowest forward voltage, and as the length of the finger is decreased, the forward voltage is increased. This is attributed to the fact that as the length of fingers is increased, the distance between the highly reflective ohmic contact layer and the n-side electrode (fingers) is decreased, thereby enhancing current spreading. According to the invention, since the fingers are formed in the diagonal direction on the upper surface of the n-type nitride semiconductor layer, the length of fingers is further increased in comparison to the prior art. Accordingly, it can be concluded that the n-type nitride semiconductor light emitting diode of the invention has an appropriate structure for enhancing the characteristics of the forward voltage.

Referring to FIG. 5b, the sample having the shortest finger generates light having the most preferable brightness. This is attributed to the fact that, as the length of the finger is increased, the active layer for generating the light is decreased in area due to the increased length of fingers. However, as shown in FIG. 5b, reduction in brightness according to the increase in finger length is relatively small. Accordingly, considering that the problems of increases in forward voltage and heat generation caused thereby in the nitride semiconductor light emitting diode are more significant, a longer finger is more preferable.

As apparent from the above description, according to the invention, the nitride semiconductor light emitting diode has the extended electrodes formed in the band along the sides of the upper surface of the n-type nitride semiconductor layer, and the n-side electrode having the plurality of fingers extended from the extended electrodes in the diagonal direction in order to decrease the distance between the n-side electrode and the highly reflective ohmic contact layer, thereby enhancing current spreading while preventing electric current from being concentrated near the n-side electrode. Furthermore, with the construction described above, the forward voltage of the light emitting diode is remarkably reduced together with reduction in an amount of heat generation.

Although the preferred embodiment of the invention have been disclosed for illustrative purpose, those skilled in the art will appreciate that various modifications, additions and substitutions are possible without departing from the scope and spirit of the invention as disclosed in the accompanying claims.

What is claimed is:

1. A flip-chip type nitride semiconductor light emitting diode, comprising:
   an n-type nitride semiconductor layer formed on a transparent substrate and having a substantially rectangular upper surface;
   an n-side electrode, the n-side electrode comprising at least one bonding pad formed adjacent to at least one corner of the upper surface of the n-type nitride semiconductor layer, extended electrodes formed in a band from the bonding pad along four sides of the upper surface of the n-type nitride semiconductor layer, and one or more fingers extended in a diagonal direction of the upper surface of the n-type nitride semiconductor layer from the bonding pad and/or the extended electrodes;

an active layer and a p-type nitride semiconductor layer sequentially stacked on a region of the n-type nitride semiconductor layer where the n-side electrode is not formed; and a highly reflective ohmic contact layer formed on the p-type nitride semiconductor layer.

2. The light emitting diode as set forth in claim 1, wherein the fingers comprise:

a plurality of first fingers extended in parallel to each other in a diagonal direction of a corner of adjacent first and second sides of the upper surface of the n-type nitride semiconductor layer from the extended electrodes formed along the adjacent first and second sides and/or from the bonding pad formed at the corner of the adjacent first and second sides; and a plurality of second fingers extended opposite to the first fingers and in parallel to each other in a diagonal direction of a corner of adjacent third and fourth sides opposite to the corner of the first and second sides of the upper surface of the n-type nitride semiconductor layer from the extended electrodes formed along the adjacent third and fourth sides and/or from the bonding pad formed at the corner of the adjacent third and fourth sides.

3. The light emitting diode as set forth in claim 2, wherein the first and second fingers are alternately disposed.

4. The light emitting diode as set forth in claim 1, further comprising:

a passivation layer formed between the n-side electrode and the highly reflective ohmic contact layer for electrically isolating the n-side electrode and the p-type nitride semiconductor layer.

5. The light emitting diode as set forth in claim 1, wherein the highly reflective ohmic contact layer comprises at least one layer composed of a material selected from the group consisting of Ag, Ni, Al, Rh, Pd, Ir, Ru, Mg, Zn, Pt, Au and combinations thereof.

6. The light emitting diode as set forth in claim 1, wherein the highly reflective ohmic contact layer comprises a first layer composed of a material selected from the group consisting of Ni, Pd, Ir, Pt and Zn, and a second layer formed on the first layer and composed of a material selected from the group consisting of Ag and Al.

7. The light emitting diode as set forth in claim 1, wherein the highly reflective ohmic contact layer comprises a first layer composed of Ni, a second layer formed on the first layer and composed of Ag, and a third layer formed on the second layer and composed of Pt.

* * * * *